United States Patent
Chao et al.

(10) Patent No.: US 10,901,248 B1
(45) Date of Patent: Jan. 26, 2021

(54) VOLTAGE AMPLIFIER CIRCUIT AND ASSOCIATED AMPLIFYING METHOD FOR FLEXIBLE WAVEFORM ADJUSTMENT

(71) Applicants: HIMAX TECHNOLOGIES LIMITED, Tainan (TW); HIMAX ANALOGIC, INC., Tainan (TW)

(72) Inventors: Shih-Wei Chao, Tainan (TW); Chien-Chuan Chung, Tainan (TW); Chih-Wei Wang, Tainan (TW)

(73) Assignees: HIMAX TECHNOLOGIES LIMITED, Tainan (TW); HIMAX ANALOGIC, INC., Tainan (TW)

( * ) Notice: Subject to any disclaimer, the term of this patent is extended or adjusted under 35 U.S.C. 154(b) by 0 days.

(21) Appl. No.: 16/655,203

(22) Filed: Oct. 16, 2019

(51) Int. Cl.
- *H03F 1/07* (2006.01)
- *G02F 1/133* (2006.01)
- *H03F 1/34* (2006.01)
- *H03F 3/16* (2006.01)
- *G02F 1/137* (2006.01)

(52) U.S. Cl.
CPC .......... *G02F 1/13306* (2013.01); *G02F 1/137* (2013.01); *H03F 1/34* (2013.01); *H03F 3/16* (2013.01)

(58) Field of Classification Search
CPC ................................. H03F 1/07; H03F 1/0288
USPC ............................................... 330/124 R, 295
See application file for complete search history.

(56) References Cited

U.S. PATENT DOCUMENTS

| | | | |
|---|---|---|---|
| 2008/0117162 A1 | 5/2008 | Song | |
| 2016/0329921 A1* | 11/2016 | Jussila | H03B 27/00 |
| 2018/0123623 A1* | 5/2018 | Liu | H03F 3/245 |
| 2018/0254786 A1* | 9/2018 | McLaurin | H04B 1/0475 |

FOREIGN PATENT DOCUMENTS

| | | |
|---|---|---|
| TW | 200305334 | 10/2003 |
| TW | 201918019 A | 5/2019 |

\* cited by examiner

*Primary Examiner* — Henry Choe
(74) *Attorney, Agent, or Firm* — Winston Hsu

(57) ABSTRACT

An embodiment of the present invention discloses a voltage amplifier circuit which includes a signal generator, a mixer and an amplifier. The signal generator is arranged to generate an input signal; the mixer is arranged to mix the input signal with an analog signal to generate an intermediate input signal having a first voltage range; and the amplifier is arranged to convert the intermediate input signal into an output signal having a second voltage range in a Rail-to-Rail manner, wherein the second voltage range is larger than the first voltage range.

18 Claims, 4 Drawing Sheets

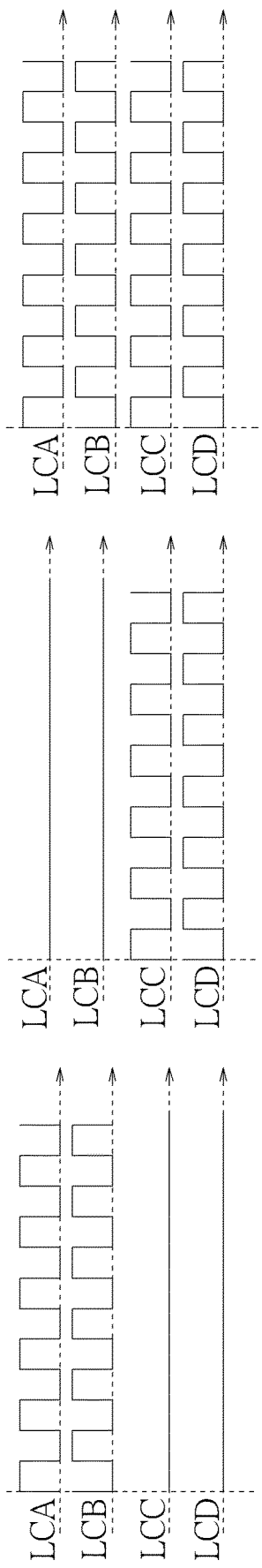
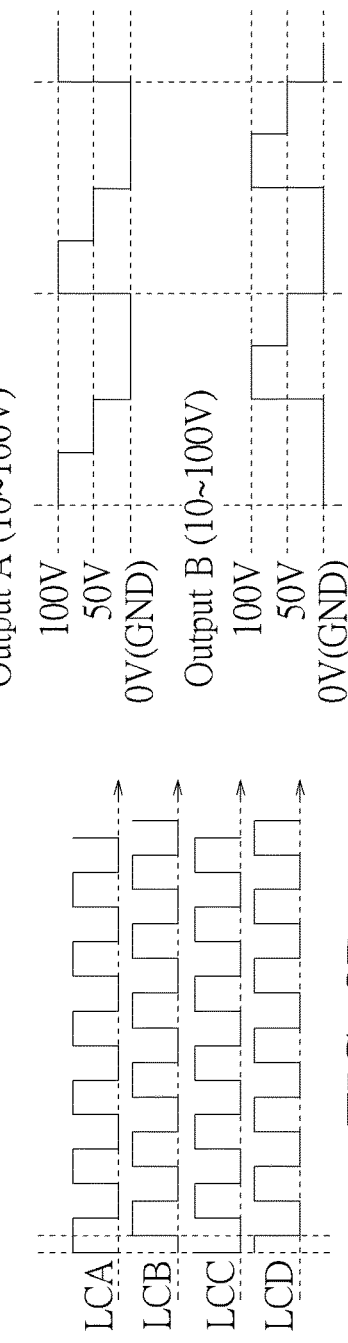
FIG. 3A  FIG. 3B  FIG. 3C  FIG. 3D  FIG. 3E

VOLTAGE AMPLIFIER CIRCUIT AND ASSOCIATED AMPLIFYING METHOD FOR FLEXIBLE WAVEFORM ADJUSTMENT

BACKGROUND OF THE INVENTION

1. Field of the Invention

The present invention relates to a voltage amplifier circuit and associated voltage amplifying method that are applicable to a liquid crystal (LC) diffuser driver. More particularly, the present invention relates to phase control solutions for LC products.

2. Description of the Prior Art

An op-amp produces an output potential that may be up to hundreds of times larger than the potential difference between its input terminals. Operational amplifiers had their origins in analog computers, where they were used to perform mathematical operations in many linear, non-linear, and frequency-dependent circuits.

The popularity of the op-amp as a functional block in analog circuits is due to its versatility. By using negative feedback, the characteristics of an op-amp circuit, its gain, input and output impedance, bandwidth etc. are determined by external components and have little dependence on temperature coefficients or engineering tolerance in the op-amp itself.

Further, op-amps are among the most widely used electronic devices nowadays, being used in a vast array of consumer, industrial, and scientific devices. However, how to effectively apply op-amps to an LC diffuser driver remains an important issue. Hence, there is a need for a novel method and associated device to improve the utility for the op-amps applied to an LC diffuser driver.

SUMMARY OF THE INVENTION

An embodiment of the present invention discloses a voltage amplifier circuit which comprises a signal generator, a mixer and an amplifier. The signal generator is arranged to generate an input signal; the mixer is arranged to mix the input signal with an analog signal, in order to generate an intermediate input signal having a first voltage range; and the amplifier is arranged to convert the intermediate input signal into an output signal having a second voltage range in a Rail-to-Rail manner, wherein the second voltage range is larger than the first voltage range.

An embodiment of the present invention discloses a voltage amplifying method applicable to a liquid crystal (LC) diffuser driver. The voltage amplifying method comprises: generating an input signal; utilizing a mixer to mix an input signal with an analog signal, in order to generate an intermediate input signal having a first voltage range; and converting the intermediate input signal into an output signal having a second voltage range in a Rail-to-Rail manner, wherein the second voltage range is larger than the first voltage range.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3A-3D illustrate the waveforms of the respective output signals of the voltage amplifier circuit shown in FIG. 2 according to different design requirements.

FIG. 3E is a diagram illustrating a set of stepped output waveforms according to a specific design requirement.

DETAILED DESCRIPTION

Some phrases in the present specification and claims refer to specific elements; however, please note that the manufacturer might use different terms to refer to the same elements. Further, in the present specification and claims, the term "comprising" is open type and should not be viewed as the term "consists of." The term "electrically coupled" can refer to either direct connection or indirect connection between elements. Thus, if the specification describes that a first device is electrically coupled to a second device, the first device can be directly connected to the second device, or indirectly connected to the second device through other devices or means.

Figure 1:
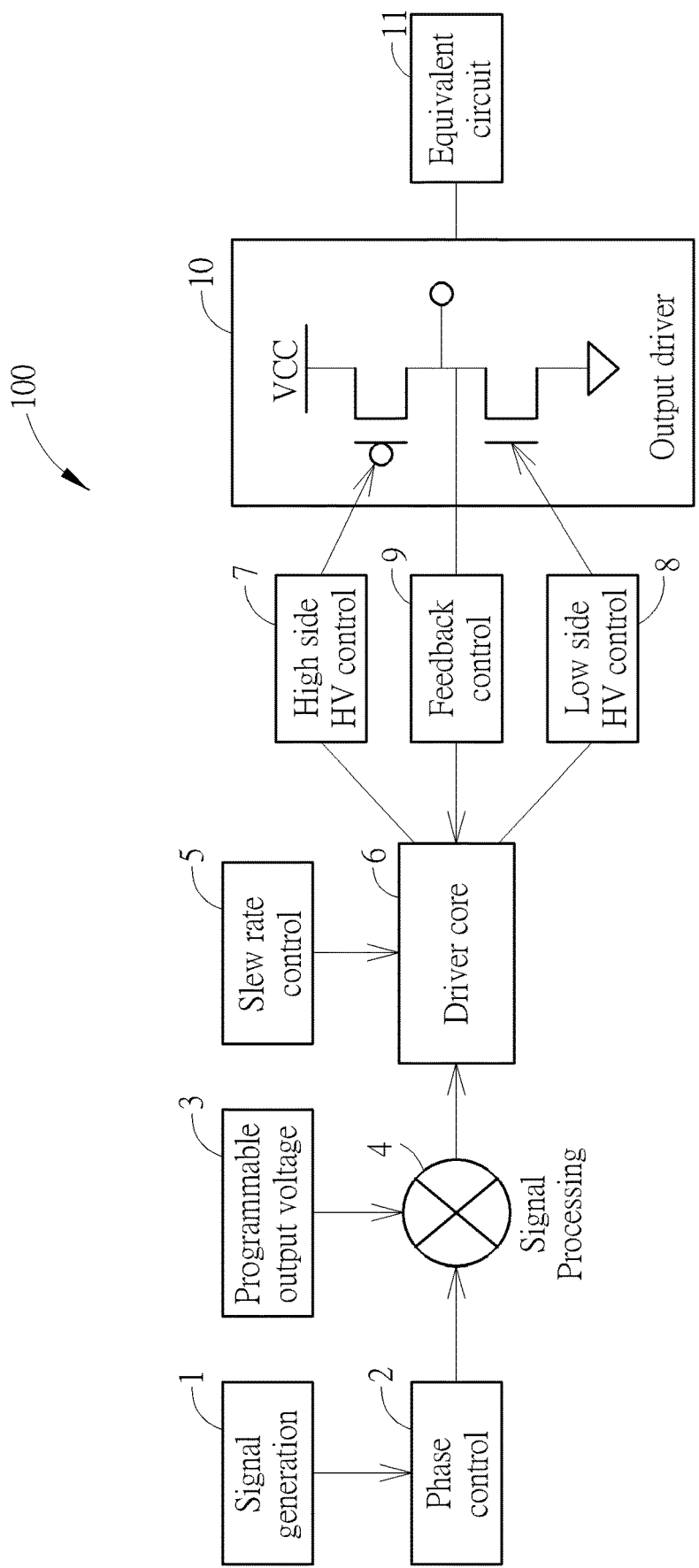
FIG. 1 is a block diagram illustrating the design concept of the voltage amplifier circuit according to an embodiment of the present invention.

Please refer to FIG. 1, which is a block diagram illustrating the design concept of the voltage amplifier circuit 100 according to an embodiment of the present invention. As shown in FIG. 1, the driver core (in Block 6) may adjust the upper and lower switches of the output driver (in Block 10) according to the signal provided by the mixer (in Block 4). Signals outputted from the output driver can be used as LC diffuser driving signals. With the slew rate control process (in Block 5), the waveform (including frequency and shape) of the output signals can be properly adjusted. In addition, the output of Block 10 can be further coupled to an equivalent circuit (in Block 11).

Figure 2:
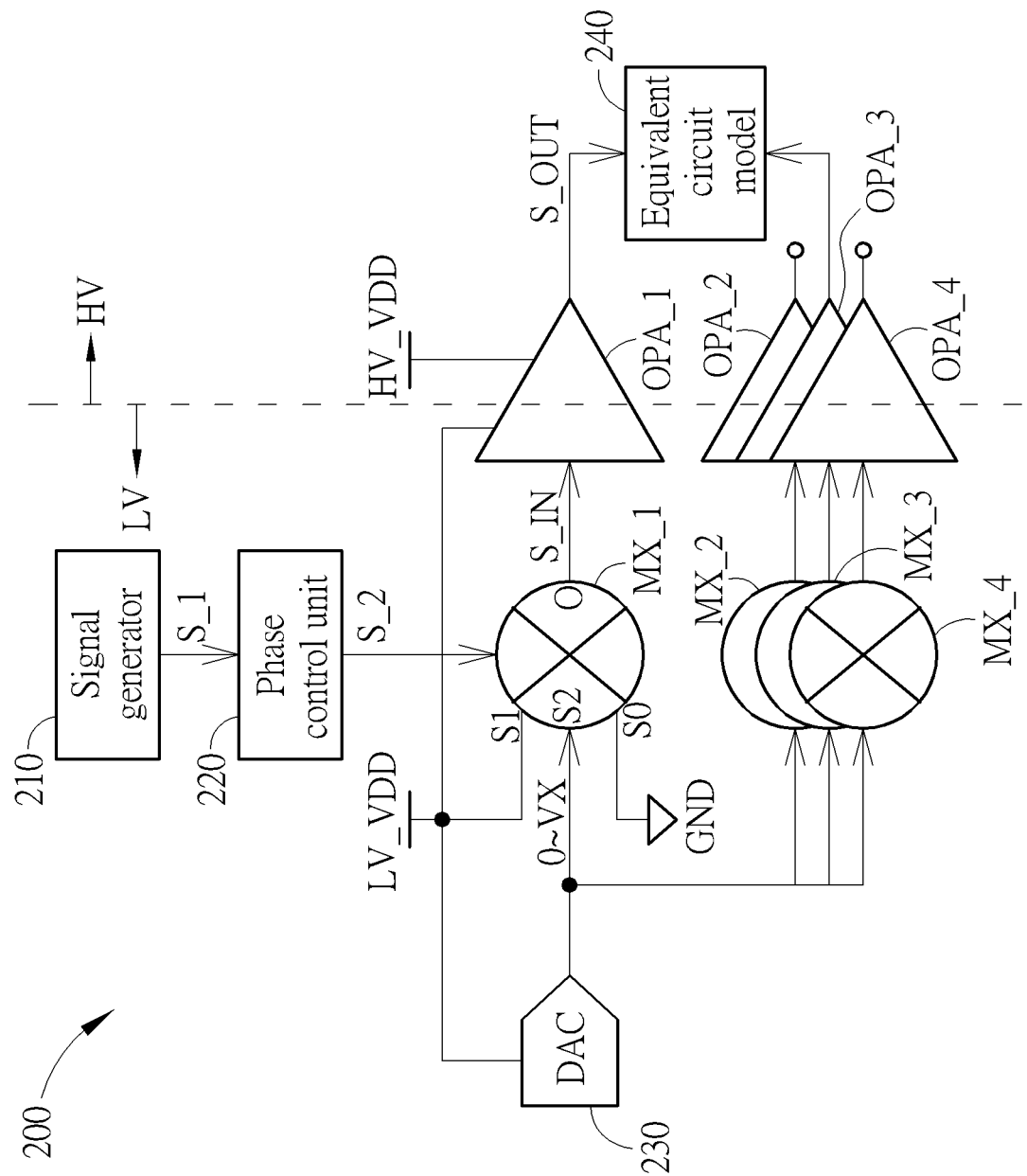
FIG. 2 is a diagram illustrating a detailed architecture based on the concept of FIG. 1 according to an embodiment of the present invention.

Please further refer to FIG. 2, which is a diagram illustrating a detailed architecture based on the concept of FIG. 1 according to an embodiment of the present invention. The voltage amplifier circuit 200 shown in FIG. 2 is applicable to an LC diffuser driver, and the voltage amplifier circuit 200 comprises a signal generator 210, a phase control unit 220, a digital-to-analog convertor (DAC) 230, an equivalent circuit model 240, and four amplification paths each comprising a mixer and an operational amplifier (op-amp). For example, the first amplification path comprises a mixer MX_1 and an op-amp OPA_1, the second amplification path comprises a mixer MX_2 and an op-amp OPA_2, the third amplification path comprises a mixer MX_3 and an op-amp OPA_3, and the fourth amplification path comprises a mixer MX_4 and an op-amp OPA_4. The signal generator 210 is arranged to generate the input signal S_1 to the phase control unit 220, wherein the signal generator 210 may be an example of Block shown in FIG. 1. The phase control unit 220 is coupled between the signal generator 210 and a corresponding mixer (e.g. the mixer MX_1 in the first amplification path), and is arranged to control respective phases of the first to fourth amplification paths by generating the phase control signal S_2. Please note that the phase control unit 220 may be an example of Block 2 shown in FIG. 1, any of the mixers MX_1-MX_4 may be an example of Block 4 shown in FIG. 1, and any of the op-amps OPA_1-OPA_4 may be an example of Blocks 6, 7, 8, 9, and 10 shown in FIG. 1. Please note that Blocks 6, 7, 8, 9, and 10 in FIG. 1 are merely for illustrative purposes, and are not meant to limit the scope of the present invention. For example, any of the op-amps OPA_1-OPA_4 may further comprise elements other that those shown in Blocks 6, 7, 8, 9, and 10. In another example, any of the op-amps OPA_1-OPA_4 is not necessary to comprise all of Blocks 6, 7, 8, 9, and 10, some of these can be omitted based on actual design requirements.

Each of the mixers MX_1-MX_4 is arranged to mix the input signal S_1 (or the phase control signal S_2) with an analog signal VX sent from the DAC 230, in order to generate an intermediate input signal S I N having a first voltage range to the corresponding op-amp (e.g. the op-amp OPA_1 in the first amplification path), wherein the DAC 230 may be an example of Block 3 shown in FIG. 1. The analog voltage VX ranges from the supply voltage LV VDD to the ground voltage GND. For example, the analog voltage VX may range from 0V to 5V (or other preset values) based on the designated signal port (e.g. based on one of the selection ports S0-S2), but the present invention is not limited thereto. Further, each of the op-amps OPA_1-OPA_4 is arranged to convert the intermediate input signal S I N at the low voltage side (marked with "LV") into an output signal S_OUT having a second voltage range in a Rail-to-Rail manner, wherein the second voltage range at the high voltage side (marked with "HV") is larger than the first voltage range. For example, the second voltage range may be 0-100V. Selection ports S0-S2 are arranged to select one of the analog voltage VX, the supply voltage LV VDD and the ground voltage GND as the designated signal, wherein the value of the intermediate input signal S I N generated by each of the mixers MX_1-MX_4 is based on the selection signal.

In addition to the aforementioned signals at the selection ports S0-S2, the DAC 230 may be used to select some other possible predetermined signals with the magnitude located between S0, S1 and S2. For example, the DAC 230 may select a signal other than S0 and S1 by using a digital signal with the value located between GND and VDD. In this way, the usage of the voltage amplifier circuit of the present invention can be more versatile and flexible, which is beneficial to users.

The output signal of the general op-amp (e.g. S_OUT) is easily attenuated by the internal resistance and thus a high voltage value is difficult to achieve. In this sense, the so-called "Rail-to-Rail" refers to the conversion between the input voltage and the output voltage is linear without distortion. The Rail-to-Rail design may provide the op-amp circuit with user-friendly advantages such as low distortion, low noise, high bandwidth gain, power saving and the like. In particular, crossover distortion is a problem commonly seen in op-amps. Assume that the bias provided by a circuit is lower and the op-amp input signal is also lower, the output waveform is more likely to cause distortion. Rail-to-Rail op-amps, however, may still provide a decent level of bandwidth even when the op-amp suffers from issues such as the low supply current and signal slew rate. Therefore, implementing OPA_1-OPA_4 in Rail-to-Rail op-amps may solve the aforementioned problem.

The equivalent circuit model 240 may be replaced with various kinds of circuit designs, and the outputs of the op-amps OPA_1-OPA_4 may be selectively coupled to the equivalent circuit model 240. In the embodiment of FIG. 2, only the outputs of the op-amps OPA_1 and OPA_3 are coupled to the equivalent circuit model 240, but the present invention is not limited thereto. In other cases, all of the outputs of the op-amps OPA_1-OPA_4 may be coupled to the equivalent circuit model 240. Please note that, the equivalent circuit model 240 may be an example of Block 11 shown in FIG. 1.

Please refer to FIGS. 3A-3D, which illustrate the waveforms of the respective output signals of the voltage amplifier circuit shown in FIG. 2 according to different design requirements. In FIGS. 3A-3D, LCA-LCD represent the waveforms of the output signals of the first to fourth amplification paths shown in FIG. 2, respectively. With a proper adjustment, the waveforms LCA-LCD may present in all kinds of waveform, such as Sine, square, triangle, and sawtooth waveforms.

FIG. 3A shows a first scenario where the phase of the output of the first amplification path is inverse to that of the second amplification path, while the outputs of the third and fourth amplification paths are disabled.

FIG. 3B shows a second scenario which is opposite to the first scenario, wherein the phase of the output of the third amplification path is inverse to that of the fourth amplification path, while the outputs of the first and second amplification paths are disabled.

FIG. 3C shows a third scenario which is equivalent to the combination of the above first and second scenarios, wherein none of the outputs of the first to fourth amplification paths is disabled.

FIG. 3D shows a fourth scenario, where the first to fourth amplification paths output square waves in different phases, respectively. The phase of the output of the second amplification path is shifted from that of the first amplification path by a specific amount, the phase of the output of the third amplification path is further shifted from that of the second amplification path by the specific amount, and the phase of the output of the fourth amplification path is further shifted from that of the third amplification path by the specific amount, so that none of the waveforms is overlapped with one another.

Please refer to FIG. 3E, which is a diagram illustrating a set of stepped output waveforms according to a specific design requirement, wherein the voltage of the output of the first amplification path is turned down by half during 0-25% duty cycle (e.g. from 100V to 50V), and is further turned down by the other half during 25-50% duty cycle (e.g. from 50V to 0V). Further, the voltage of the output of the second amplification path is turned down by half during 50-75% duty cycle, and is further turned down by the other half during 75-100% duty cycle. The stepped output waveforms are applicable to a liquid crystal (LC) diffuser driver, especially suitable when it operates under an extreme high voltage (such as 10V-100V). To turn off the high voltage in a one-shot manner may cause the liquid crystals unable to respond punctually. That is, the rapid drop from high voltage (e.g. 100V) to a low voltage (e.g. 0V) leaves a very short time for the liquid crystals to rotate, and the liquid crystals probably only rotate halfway. With turning off the waveforms in a two-step manner (or even configured in more steps to form a ladder shape), the waveforms provided by present invention are capable of making the liquid crystals be able to respond in time.

Figure 4:
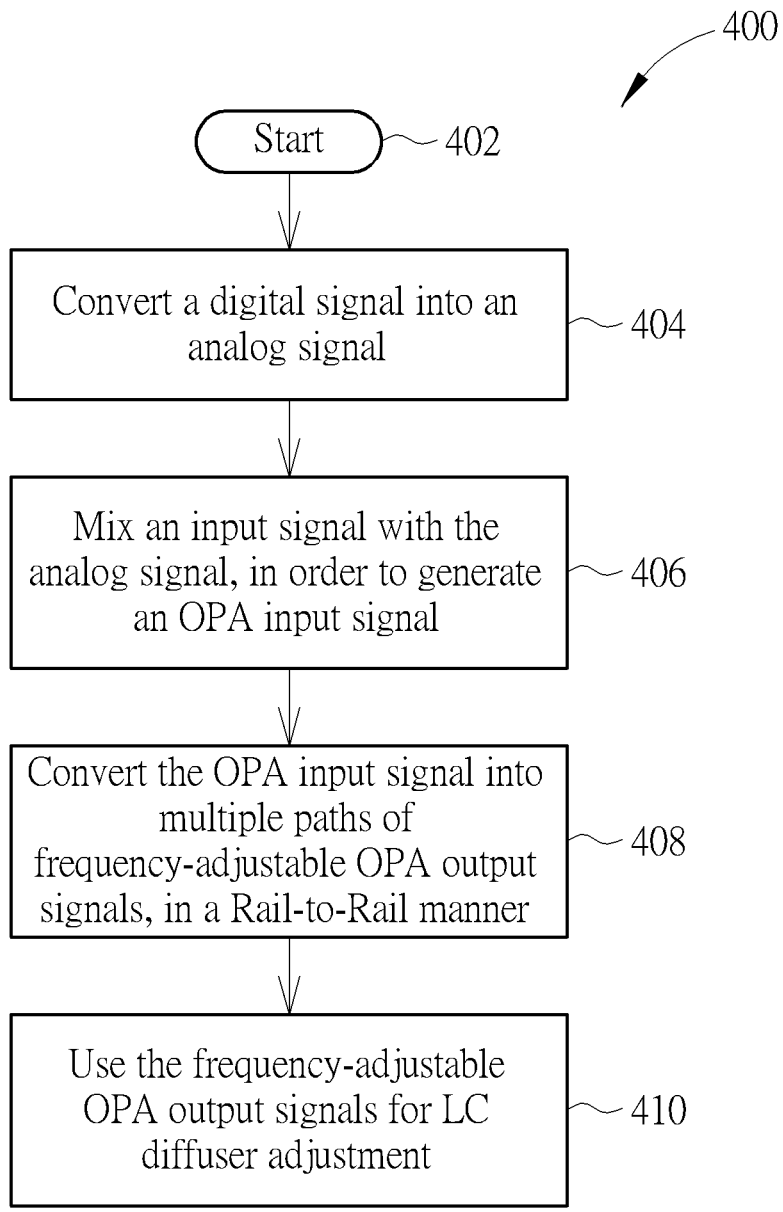
FIG. 4 is a flowchart illustrating a voltage amplifying method 400 according to an embodiment of the present invention.

The operations of the voltage amplifier circuit 100 or 200 may be summarized by FIG. 4. FIG. 4 is a flowchart illustrating a voltage amplifying method 400 according to an embodiment of the present invention. If the result is substantially the same, the steps are not required to be executed in the exact order shown in FIG. 4. The method 400 is summarized as follows.

Step 402: Start;

Step 404: Convert a digital signal into an analog signal;

Step 406: Mix an input signal with the analog signal in order to generate an OPA input signal;

Step 408: Convert the OPA input signal into multiple paths of frequency-adjustable OPA output signals in a Rail-to-Rail manner;

Step 410: Use the frequency-adjustable OPA output signals for LC diffuser adjustment.

The above voltage amplifier method illustrates operations of the voltage amplifier circuit 100 or 200. As one skilled in the art can be readily to understand details of each step after reading above paragraphs directed to the voltage amplifier circuit 100 or 200, further descriptions are omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage amplifier circuit, applicable to a liquid crystal (LC) diffuser driver, comprising:
    a signal generator, arranged to generate an input signal;
    a mixer, arranged to mix the input signal with an analog voltage, in order to generate an intermediate input signal having a first voltage range, wherein the mixer is an adjustable mixer selectively coupled to the analog voltage, a supply voltage and a ground voltage, and the analog voltage ranges between the supply voltage and the ground voltage; and
    an amplifier, arranged to convert the intermediate input signal into an output signal having a second voltage range in a Rail-to-Rail manner, wherein the second voltage range is larger than the first voltage range.

2. The voltage amplifier circuit of claim 1, further comprising:
    a digital-to-analog convertor (DAC), arranged to convert a digital signal into the analog voltage.

3. The voltage amplifier circuit of claim 1, further comprising:
    a plurality of selection ports, arranged to select one of the analog voltage, the supply voltage and the ground voltage as a designated signal, wherein the value of the intermediate input signal generated by the mixer is based on the designated signal.

4. The voltage amplifier circuit of claim 1, wherein the amplifier is a Rail-to-Rail operational amplifier (op-amp).

5. The voltage amplifier circuit of claim 1, wherein the mixer and the amplifier forms a first amplification path, and the voltage amplifier circuit further comprises:
    at least a second amplification path; and
    a phase control unit, coupled between the signal generator and the mixer, the phase control circuit arranged to control respective phases of the first amplification path and the second amplification path.

6. The voltage amplifier circuit of claim 5, further comprising:
    a third amplification path and a fourth amplification path;
    wherein the first to fourth amplification paths output square waves, wherein the phase of the output of the first amplification path is in-phase to that of the third amplification path, the phase of the output of the second amplification path is in-phase to that of the fourth amplification fourth, and the phase of the output of the first amplification path is inverse to that of the second amplification path.

7. The voltage amplifier circuit of claim 5, further comprising:
    a third amplification path and a fourth amplification path;
    wherein the first to fourth amplification paths output square waves in different phases respectively, wherein the phase of the output of the second amplification path is shifted from that of the first amplification path by a specific amount, the phase of the output of the third amplification path is further shifted from that of the second amplification path by the specific amount, and the phase of the output of the fourth amplification path is further shifted from that of the third amplification path by the specific amount.

8. The voltage amplifier circuit of claim 5, wherein the voltage of the output of the first amplification path is turned down by half during 0-25% duty cycle, and is further turned down by the other half during 25-50% duty cycle.

9. The voltage amplifier circuit of claim 8, wherein the voltage of the output of the second amplification path is turned down by half during 50-75% duty cycle, and is further turned down by the other half during 75-100% duty cycle.

10. A voltage amplifying method, applicable to a liquid crystal (LC) diffuser driver, comprising:
    generating an input signal;
    utilizing a mixer to mix an input signal with an analog voltage, in order to generate an intermediate input signal having a first voltage range, wherein the mixer is an adjustable mixer selectively coupled to the analog voltage, a supply voltage and a ground voltage, and the analog voltage ranges between the supply voltage and the ground voltage; and
    converting the intermediate input signal into an output signal having a second voltage range in a Rail-to-Rail manner, wherein the second voltage range is larger than the first voltage range.

11. The voltage amplifying method claim 10, further comprising:
    receiving a digital signal, and converting the digital signal into the analog voltage.

12. The voltage amplifying method claim 10, further comprising:
    selecting one of the analog voltage, the supply voltage and the ground voltage as a designated signal, wherein the value of the intermediate input signal generated by the mixer is based on the designated signal.

13. The voltage amplifying method claim 10, wherein the amplifier is a Rail-to-Rail operational amplifier (op-amp).

14. The voltage amplifying method claim 10, wherein the mixer and the amplifier forms a first amplification path, the voltage amplifier circuit further comprises at least a second amplification path and the phase control unit coupled between the signal generator and the mixer, and the phase control circuit is arranged to perform the following step:
    controlling respective phases of the first amplification path and the second amplification path.

15. The voltage amplifying method claim 14, wherein the first amplification path, the second amplification path, a third amplification path and a fourth amplification path output square waves, and the voltage amplifying method further comprises:
    configuring the phase of the output of the first amplification path to be in-phase to that of the third amplification path, configuring the phase of the output of the second amplification path to be in-phase to that of the fourth amplification fourth, and configuring the phase of the output of the first amplification path to be inverse to that of the second amplification path.

16. The voltage amplifying method claim 14, wherein the first amplification path, the second amplification path, a third amplification path and a fourth amplification path output square waves, and the voltage amplifying method further comprises:

shifting the phase of the output of the second amplification path from that of the first amplification path by a specific amount;

further shifting the phase of the output of the third amplification path from that of the second amplification path by the specific amount; and further shifting the phase of the output of the fourth amplification path from that of the third amplification path by the specific amount.

17. The voltage amplifying method claim 14, wherein the voltage of the output of the first amplification path is turned down by half during 0-25% duty cycle, and is further turned down by the other half during 25-50% duty cycle.

18. The voltage amplifying method claim 17, wherein the voltage of the output of the second amplification path is turned down by half during 50-75% duty cycle, and is further turned down by the other half during 75-100% duty cycle.

* * * * *